United States Patent
Marreiro et al.

(10) Patent No.: US 8,723,264 B2
(45) Date of Patent: May 13, 2014

(54) ELECTROSTATIC DISCHARGE DEVICES AND METHOD OF MAKING THE SAME

(71) Applicants: David D. Marreiro, Chandler, AZ (US); Steven M. Etter, Phoenix, AZ (US); Sudhama C. Shastri, Phoenix, AZ (US)

(72) Inventors: David D. Marreiro, Chandler, AZ (US); Steven M. Etter, Phoenix, AZ (US); Sudhama C. Shastri, Phoenix, AZ (US)

(73) Assignee: Semicondutor Components Industries, LLC, Phoenix, AZ (US)

( * ) Notice: Subject to any disclaimer, the term of this patent is extended or adjusted under 35 U.S.C. 154(b) by 51 days.

(21) Appl. No.: 13/653,654

(22) Filed: Oct. 17, 2012

(65) Prior Publication Data
US 2014/0103484 A1   Apr. 17, 2014

(51) Int. Cl.
*H01L 23/62* (2006.01)

(52) U.S. Cl.
USPC ............................. 257/355; 257/603; 438/983

(58) Field of Classification Search
USPC .................................. 257/355, 603; 438/983
See application file for complete search history.

(56) References Cited

U.S. PATENT DOCUMENTS

| | | | |
|---|---|---|---|
| 7,538,395 B2 | 5/2009 | Keena et al. | |
| 7,579,632 B2 | 8/2009 | Salih et al. | |
| 7,812,367 B2 | 10/2010 | Salih et al. | |
| 8,089,095 B2 | 1/2012 | Salih et al. | |
| 8,110,448 B2 | 2/2012 | Salih et al. | |
| 8,236,625 B2 | 8/2012 | Salih et al. | |
| 2012/0080769 A1* | 4/2012 | Sharma et al. | 257/529 |

* cited by examiner

*Primary Examiner* — Mark Prenty
(74) *Attorney, Agent, or Firm* — Noon Intellectual Property Law, P.C.

(57) ABSTRACT

In one embodiment, electrostatic discharge (ESD) devices are disclosed.

20 Claims, 8 Drawing Sheets

ELECTROSTATIC DISCHARGE DEVICES AND METHOD OF MAKING THE SAME

BACKGROUND

The semiconductor industry has utilized various methods and structures to form electrostatic discharge (ESD) protection devices. According to one international specification, the International Electrotechnical Commission (IEC) specification commonly referred to as IEC 61000-4-2 (level 2), it is desirable for an ESD device to respond to a high input voltage and current within approximately 1 nanosecond (the IEC has an address at 3, rue de Varembe, 1211 Geneve 20, Switzerland).

Some of the prior ESD devices used a zener diode and a P-N junction diode to attempt to provide ESD protection. In general, the prior ESD devices had to trade-off low capacitance against having a sharp breakdown voltage characteristic. The sharp breakdown voltage characteristic was needed to provide a low clamp voltage for the ESD device. In most cases, the device structures had a high capacitance, generally greater than about one to six (1-6) picofarads. The high capacitance limited the response time of the ESD device. Some prior ESD devices operated in a punch-through mode which required the devices to have a very thin and accurately controlled epitaxial layer, generally less than about 2 microns thick, and required a low doping in the epitaxial layer. These structures generally made it difficult to accurately control the clamping voltage of the ESD device and especially difficult to control low clamping voltages, such as voltages of less than about ten volts (10 V).

Accordingly, it is desirable to have an electrostatic discharge (ESD) device that has a low capacitance, that has a fast response time, that reacts to both a positive and a negative ESD event, that has a well-controlled clamp voltage, that is easy to control in manufacturing, and that has a clamp voltage that can be controlled to over a range of voltages from a low voltage to a high voltage.

BRIEF DESCRIPTION OF THE DRAWINGS

Embodiments of present invention will become more fully understood from the detailed description and the accompanying drawings, which are not intended to limit the scope of the present application.

Figure 1:
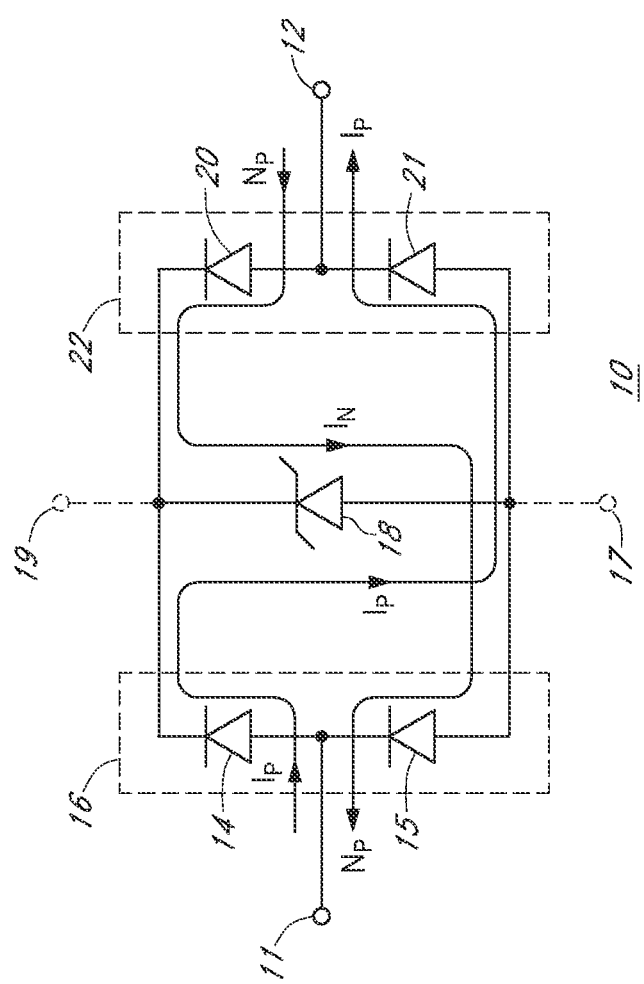
FIG. 1 schematically illustrates one example of a portion of an electrostatic discharge (ESD) device in accordance with some embodiments of the present application.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION

The following description of embodiment(s) is merely illustrative in nature and is in no way intended to limit the invention, its application, or uses. The present application includes, among other things, an ESD device having: a semiconductor substrate of a first conductivity type and having a first doping concentration, the semiconductor substrate having first and second surfaces; a first semiconductor layer of a second conductivity type on the first surface of the semiconductor substrate, wherein the first semiconductor layer has a first surface that is disposed between the first surface of the semiconductor substrate and a second surface of the semiconductor layer, and wherein the first semiconductor layer has a second doping concentration; a first semiconductor region of the second conductivity type positioned between a first portion of the first semiconductor layer and the first surface of the semiconductor substrate, the first semiconductor region forming a zener diode with dopants of the semiconductor substrate; a first P-N diode formed in the first semiconductor layer and overlying a first portion of the first semiconductor region, wherein the first P-N diode is internal to the first isolation trench; a first isolation trench extending from the second surface of the first semiconductor layer into a portion of the first semiconductor region, the first isolation trench forming a closed structure that surrounds the first P-N diode and a second portion of the first semiconductor layer overlaying the first semiconductor region; and a second P-N diode formed in the first semiconductor layer and laterally displaced from the first semiconductor region, wherein the second P-N diode is external to the first isolation trench.

DETAILED DESCRIPTION OF DRAWINGS

FIG. 1 schematically illustrates one example of a portion of an electrostatic discharge (ESD) protection device or ESD device 10 that has a low capacitance and a fast response time. Device 10 includes two terminals, first terminal 11 and second terminal 12, and is configured to provide bidirectional ESD protection between terminals 11 and 12. Either of terminal 11 and terminal 12 can be an input terminal or an output terminal. The output terminal usually is connected to another element (not shown) that is to be protected by device 10. For example, terminal 12 may be used as the output terminal and connected to the high side of a regulated power supply (such as a 5V supply). Device 10 is configured to have a low capacitance between terminal 11 and terminal 12. Device 10 also is formed to limit the maximum voltage that is formed between terminal 11 and terminal 12 to the clamp voltage of device 10. Furthermore, device 10 is formed to have a sharp knee or sharp breakdown voltage characteristic that assists in accurately controlling the value of the clamp voltage. The low capacitance assists in providing device 10 with a fast response time. Device 10 includes a plurality of steering diode channels that includes first steering diode channel 16 and second steering diode channel 22. Channel 16 includes first steering diode 14 that has an anode commonly connected to terminal 11 and to cathode of second steering diode 15. Channel 22 includes third steering diode 20 that has an anode commonly connected to terminal 12 and to a cathode of fourth steering diode 21. Diode 14, diode 15, diode 20, and diode 21 are formed as PN junction diodes that have a low capacitance. Zener diode 18 is connected in parallel with each of channel 16 and channel 22. Diode 18 has an anode connected to the anode of diode 15 and diode 21, and a cathode connected to the cathode of diode 14 and diode 20.

In normal operation, device 10 is biased to a normal operating voltage, such as a voltage that is between about one volt (1V) and zener voltage of diode 18, such as by applying about one volt (1V) to terminal 11 and a ground reference voltage to terminal 12. Because of the hereinafter described characteristics of device 10, the capacitance of device 10 remains low as the voltage between terminal 11 and terminal 12 varies over this normal operating voltage. However, the capacitance of an ESD device is customarily specified with zero volts applied across the device. This zero voltage condition is normally referred to as a zero bias condition. As will be seen further hereinafter, at this zero bias condition the hereinafter described low capacitance features of device 10 forms very low capacitance values for diode 14, diode 15, diode 20, and diode 21. Since there are two parallel paths between terminal 11 and terminal 12, the capacitance value of each path is the additive product of the capacitances in each path. The first path includes the capacitances of diode 14, diode 18 and diode 21 in series. Since the capacitance of capacitors in series is smaller than that of the smallest capacitor, then the capacitance of the first path is smaller than the capacitance of either of diode 14, diode 18, or diode 21. Device 10 is formed so that the zero bias capacitance of diode 14 and diode 21 are very small as will be seen further hereinafter. Similarly, the capacitance of the second path, that includes diode 20, diode 18, and diode 15, is also very small. The overall additive value of the two paths forms a small zero bias capacitance for device 10.

If a positive electrostatic discharge (ESD) event is received on terminal 11, terminal 11 is forced to a large positive voltage relative to terminal 12. The large positive voltage forward biases diode 14 and diode 21 and reverse biases diode 18 in addition to diode 15 and 20. As the voltage between terminal 11 and terminal 12 reaches the positive threshold voltage of device 10 (the forward voltage of diode 14 and diode 21 plus the zener voltage of diode 18) a positive current (Ip) flows from terminal 11 through diode 14 to diode 18, and through diode 18 and diode 21 to terminal 12. The zener voltage of diode 18 clamps the maximum voltage formed between terminals 11 and 12 to approximately the zener voltage of diode 18 (plus the forward voltage of diode 14 and diode 21). If a negative ESD event is received on terminal 11, terminal 11 is forced to a large negative voltage relative to terminal 12. The large negative voltage forward biases diode 20 and diode 15, and reverse biases diode 18 in addition to diode 14 and diode 21. As the voltage between terminal 11 and terminal 12 reaches the negative threshold voltage of device 10 (the forward voltage of diode 20 and diode 15 plus the zener voltage of diode 18) a negative current (In) flows from terminal 12 through diode 20 to diode 18, and through diode 18 and diode 15 to terminal 11. The sharp knee of diode 18 causes diode 18 to rapidly clamp the maximum voltage between terminal 11 and 12 to the zener voltage of diode 18 (plus the forward voltage of diode 15 and diode 20).

Device 10 can also optionally include third terminal 19 connected to the cathode of diode 18. Third terminal 19 can be connected to the voltage rail of a power supply. Device 10 may also optionally include fourth terminal 17. Fourth terminal 17 may be connected to a ground reference potential of the system in which device 10 is used.

Figure 2:
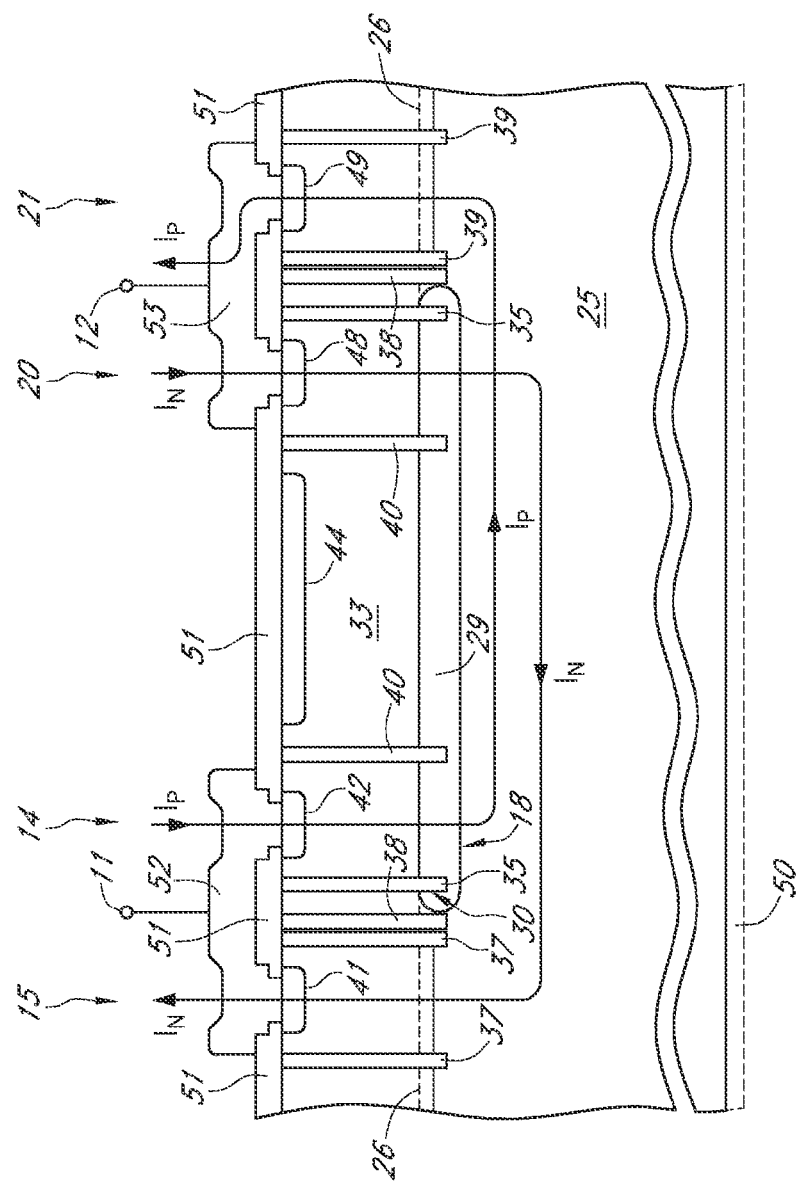
FIG. 2 illustrates a cross-sectional view of a portion of one example of an ESD device in accordance with some embodiments of the present application.

FIG. 2 illustrates a cross-sectional view of a portion of one example of ESD device 10. Diode 14, diode 15, diode 20, diode 21, and diode 18 are formed on semiconductor substrate 25. Diode 14, diode 15, diode 20, diode 21, and diode 18 are identified in a general manner by arrows. Semiconductor layer 33 is formed on substrate 25, such as by epitaxial growth, and a portion of layer 33 may function as a drift region for diode 14, diode 15, diode 20, and diode 21.

Figure 3:
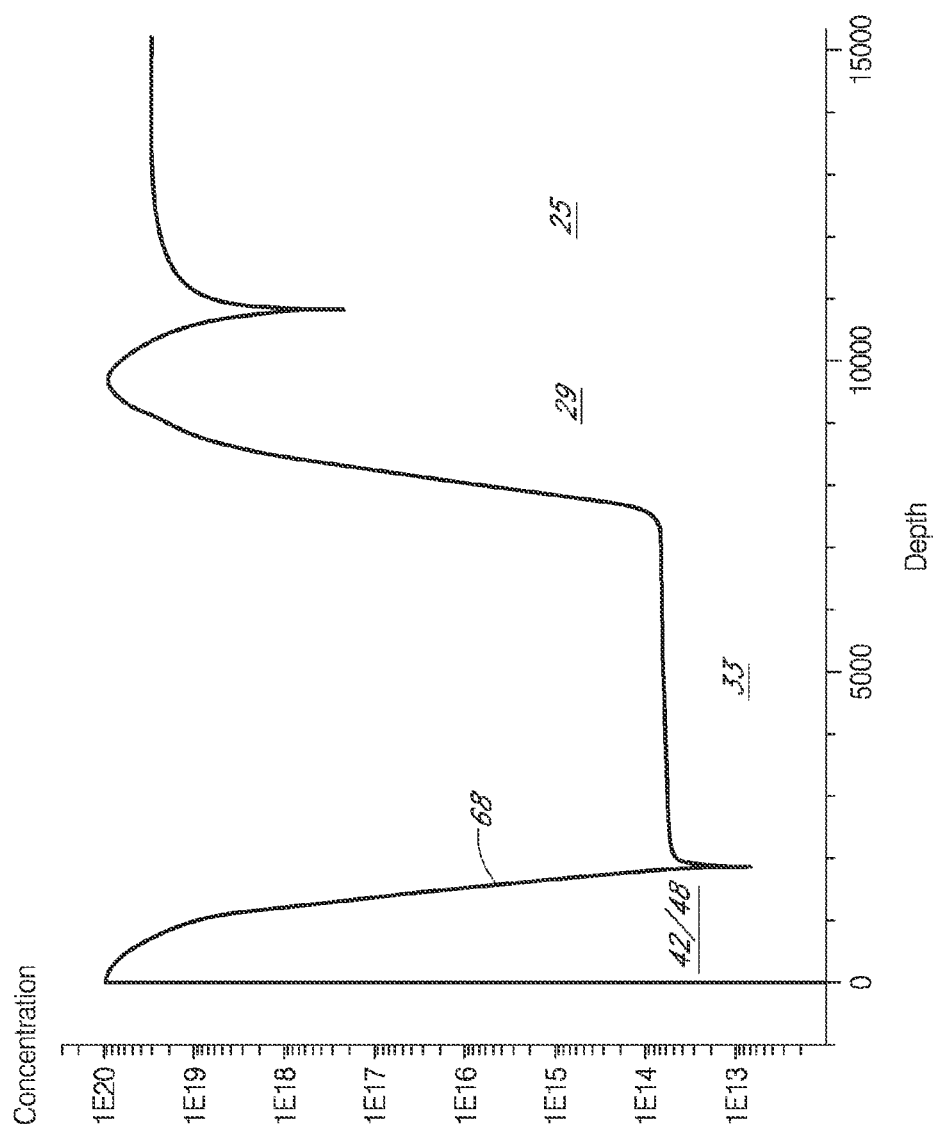
FIG. 3 is a graph illustrating one example of the carrier concentration profile for an ESD device in accordance with some embodiments of the present application.

FIG. 3 is a graph illustrating one example of the carrier concentration profile for device 10. The abscissa indicates depth from the surface of layer 33 into device 10 and the ordinate indicates increasing value of the carrier concentration. Plot 68 illustrates the carrier concentration of device 10 that results from a positive bias applied from terminal 11 to terminal 12 (such as by a positive ESD event). This description has references to FIGS. 1 to 3.

Semiconductor region 29 is formed near the interface of the dopants that form layer 33 and the dopants of substrate 25 in order to form diode 18. In some embodiments, substrate 25 is formed with a P-type conductivity having a doping concentration that is no less than approximately $1 \times 10^{19}$ atoms/cm$^3$ and typically between approximately $1 \times 10^{19}$ and $1 \times 10^{21}$ atoms/cm$^3$. In some embodiments, semiconductor region 29 is formed as an N-type region having a peak doping concentration that is no less than approximately $1 \times 10^{19}$ atoms/cm$^3$ and typically is between approximately $1 \times 10^{19}$ and $1 \times 10^{21}$ atoms/cm$^3$. Additionally, the thickness of region 29 can be less than one micron and typically is between about one and three (1-3) microns. Because of the small thickness of region 29 in addition to the high doping concentration of region 29 and substrate 25, when device 10 receives a positive voltage from terminal 11 to terminal 12, the voltage causes the carrier concentration to be confined to a small and high density area within region 29 and near to the interface with substrate 25. This high concentration of carriers and dopants provides zener diode 18 with a very sharp transition or knee and allows very accurate control over the breakdown voltage or zener voltage of diode 18. The breakdown voltage or zener voltage of diode 18 can be adjusted by changing the carrier concentration or carrier profile of region 29 and/or of substrate 25. This may allow precisely controlling the breakdown voltage for specific applications such as for five or twelve or twenty-four volt (5V, 12V, 24V) breakdown voltage application.

Layer 33 can be formed to have a lower peak doping concentration that is at least one order of magnitude less than the doping concentration of region 29 and typically is between about $1 \times 10^{13}$ and $1 \times 10^{17}$ atoms/cm$^3$. Layer 33 and region 29 may be formed on substrate 25 by a variety of methods that are well known to those skilled in the art. For example, a thin N-type epitaxial layer, illustrated by a dashed line 26, may be formed on substrate 25 as a first portion of layer 33. This first portion may be doped to form region 29. Thereafter, the remainder of layer 33 may be formed.

Isolation trench 35, isolation trench 37, isolation trench 39, and isolation trench 40 may be formed in order to isolate the portions of layer 33 where diode 14 and diode 20 are to be formed from the portions of layer 33 where diode 15 and diode 21 are to be formed. Isolation trench 35 and isolation trench 40 both extend through layer 33 and a portion of region 29. Isolation trench 37 and isolation trench 39 both extend through layer 33 and a portion of substrate 25. In some embodiments, isolation trench 35, isolation trench 37, isolation trench 39, and isolation trench 40 each have about the same depth. In some embodiments, isolation trench 35, isolation trench 37, isolation trench 39, and isolation trench 40 can each be formed at about the same time during a process from making the device.

Isolation trench 38 surrounds region 29, isolation trench 35 and isolation trench 40, and may reduce leakage between region 29 and the remainder of the die. In some embodiments, isolation trench 38, isolation trench 35, and isolation trench 40 have about the same depth. Isolation trench 38 is optional, and therefore some embodiments of device 10 do not include isolation trench 38. In some embodiments, isolation trench 35, isolation trench 37, isolation trench 39, isolation trench 38, and isolation trench 40 can each be formed at about the same time during a process from making the device.

Trench 35, trench 37, trench 38, trench 39, and trench 40 generally are formed by creating openings from a top surface of layer 33, through layer 33, and extending into either substrate 25 or region 29. Trench 35, trench 37, trench 38, trench 39, and trench 40 are provided with isolation such as by forming dielectric liner 30 along the sidewalk and bottoms of the trenches and filling the remaining opening with a dielectric or with doped or undoped polysilicon. Methods to form trench 35, trench 37, trench 38, trench 39, and trench 40 are well known to those skilled in the art. Trench 35 may be formed as a closed polygon with a periphery that has an opening which encloses a portion of region 29, thus, trench 35 may be regarded as a multiply-connected domain. Similarly, each of, trench 37, trench 38, trench 39, and trench 40 may be regarded as a multiply-connected domain and may be a closed polygon. Each of trench 35, trench 37, trench 38, trench 39 and trench 40 may be viewed as a blocking structure that minimizes electrical coupling between the enclosed portions and other portions of device 10.

Diode 14 includes doped region 42 that is formed on the surface of layer 33 with the same conductivity as substrate 25. Region 42 is formed to extend into layer 33 and overlie region 29. Region 42 may be positioned so that the periphery of region 42, such as a periphery formed at the surface of layer 33, is completely surrounded by trench 35 and optionally trench 38. In some embodiments, trench 35 is one continuous trench that is formed around region 42. Because trench 35 extends through layer 33, it reduces the amount of layer 33 that is coupled with region 42, thereby assisting in increasing the capacitance linearity.

Similarly, diode 20 includes doped region 48 that is formed on the surface of layer 33 with the same conductivity as substrate 25. Region 48 is formed to extend into layer 33 and overlie region 29. Region 48 may be positioned so that the periphery of region 48, such as a periphery formed at the surface of layer 33, is completely surrounded by trench 40 and optionally trench 38. In some embodiments, trench 40 is one continuous trench that is formed around region 48. Because trench 40 extends through layer 33, it reduces the amount of layer 33 that is coupled with region 48, thereby assisting in increasing the capacitance linearity.

The peak doping concentration of region 42 and region 48 generally is greater than the peak doping concentration of layer 33 and may be approximately equal to the peak doping concentration of substrate 25. Region 42 and region 48 generally are formed to extend a distance no greater than about two (2) microns and typically about one tenth to two (0.1-2) microns from the surface into layer 33. The large differential doping concentration between region 42 and layer 33 and also between region 48 and layer 33 and the shallow depth of regions 42 and 48 assists in providing respective diode 14 and diode 20 with a very small zero bias capacitance. This very small zero bias capacitance of diode 14 and diode 20 assists in forming a small zero bias capacitance for device 10 as indicated hereinbefore. The capacitance of each of diode 14, diode 18, and diode 20 at zero bias may, in some embodiments, be less than about 0.4 picofarads and the equivalent series capacitance of diode 14, diode 18, and diode 20 forms a capacitance for device 10 that is no greater than about 0.2 picofarads and typically no greater than about 0.1 picofarads.

Doped region 49 is formed in layer 33 with the opposite conductivity to substrate 25 in order to form diode 21. Similarly, a doped region 41 is formed in layer 33 with the opposite conductivity to substrate 25 in order to form diode 15. Region 41 and region 49 are formed on the surface of layer 33 and may extend approximately the same distance into layer 33 as region 42 and region 48. However, region 41 and region 49 do not overlie region 29. Region 41 is positioned so that the periphery of region 41, such as the periphery at the surface of layer 33, is completely surrounded by trench 37 and region 49 is positioned so that the periphery of region 49, such as the periphery at the surface of layer 33, is completely surrounded by trench 39. Each of trench 37 and trench 39 typically are formed as one continuous trench. Because trench 37 and trench 38 extend through layer 33, they reduce the amount of layer 33 that is coupled with respective region 41 and region 49 thereby assisting in reducing the capacitance of respective diodes 15 and 21. In some embodiments, region 41 and region 49 have a peak doping concentration that is greater than the peak doping concentration of layer 33 and may be approximately equal to the peak doping concentration of substrate 25.

Region 42 and region 48 generally are separated from region 29 by a distance that assists in minimizing the capacitance of diodes 15 and 21. The spacing generally is approximately two to twenty (2-20) microns. The portion of layer 33 that is between regions 42 and 29 and between region 48 and region 29 forms a drift region of respective diode 14 and diode 20. The thickness of the drift region of layer 33 generally is at least around two microns in order to reduce the formation of parasitic transistors and to ensure that device 10 does not operate in a punch-through operating region.

Figure 4:
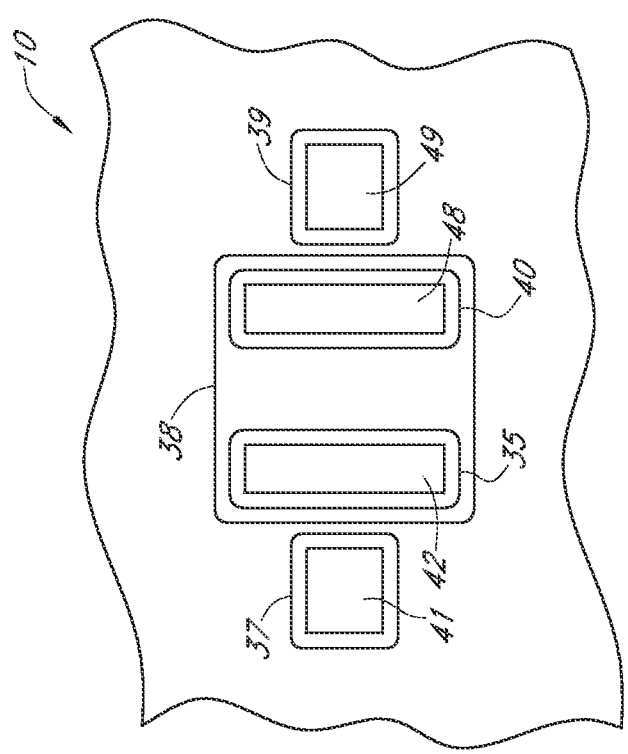
FIG. 4 is an enlarged partial plan view of one example of an ESD device in accordance with some embodiments of the present application.

FIG. 4 is an enlarged partial plan view of one example of device 10. Region 41 is enclosed by isolation trench 37, while region 49 is enclosed by isolation trench 39. Isolation trench 35 encloses region 42, while isolation trench 40 encloses region 48. Isolation trench 38 encloses region 29, region 42, and region 48.

Returning to FIG. 2, an optional doped region 44 may be formed in layer 33 with the opposite conductivity to substrate 25. Region 44 usually is formed to overlie region 29 and positioned between region 42 and region 48, thus, region 44 is optionally within the multiply-connected domain formed by trench 38. Region 44 can extend approximately the same distance into layer 33 as region 42 and region 48. In some embodiments, region 44 may be omitted. Device 10 can be devoid of a doped region having a conductivity that is the same as substrate 25 and that is positioned between diode 14 and region 29, thus between region 42 and region 29.

When device 10 receives a positive ESD voltage on terminal 11 relative to terminal 12, diode 14 and diode 21 are forward biased and diode 15 and diode 20 are reverse biased. Because of these depletion regions, the carrier density in layer 33 is further reduced from the zero bias condition which assists in further reducing the capacitance of device 10. The capacitance of device 10 at zero bias generally is less than about 0.4 picofarads and the equivalent series capacitance for device 10 is no greater than about 0.2 picofarads and may be no greater than about 0.1 picofarads.

When device 10 receives a negative voltage on terminal 11 relative to terminal 12, diode 20 and diode 15 are forward biased and diode 14 and diode 21 are reverse biased. Because of these depletion regions, the carrier density in layer 33 is further reduced from the zero bias condition which assists in further reducing the capacitance of device 10. Note that for both of the ESD discharge events, the ESD current flow is into and out of the top surface of substrate 25 and layer 33. The ESD current does not flow through the bottom surface of substrate 25, thus, the bottom surface of substrate 25 generally has a floating potential.

A dielectric 51 may be formed on the surface of layer 33. Openings generally are formed through dielectric 51 to expose portions of region 41, region 42, region 48, and region 49. Conductor 52 may be applied to make electrical contact to both region 41 and region 42. Conductor 53 may be applied to make electrical contact to both region 48 and region 49. Conductor 52 and conductor 53 may be subsequently connected to respective terminal 11 and terminal 12. Since the ESD current flow of device 10 is not through the bottom surface of substrate 25, a conductor generally is not applied thereto.

When an electro-static discharge occurs, there is generally a large voltage and current spike that occurs over a brief period of time. Generally, the peak current and peak voltage occurs over a period of a few nanoseconds, typically less than two nanoseconds (2 nsec.) and could last for only about one nanosecond (1 nsec.). The current generally decreases to a plateau for another time interval usually around twenty (20) nanoseconds and slowly decreases over another twenty to forty (20-40) nanoseconds. The peak value of the current could be between one to thirty amperes (1 to 30 amps) and the peak voltage could be between two thousand and thirty thousand volts (2000-30000 V). The size and response time of the elements of device 10 can be configured to respond to the voltage during the time interval of the peak voltage and conduct the peak current. During an ESD event between terminal 11 and terminal 12, either of diode 14 and diode 21 are connected in series and diode 15 and diode 20 are connected in series, the effective capacitance is the total series capacitance. Because capacitors in series result in a capacitance that is less than the smallest capacitance, the low capacitance ensures that the capacitance of device 10 is low enough for device 10 to respond to the ESD event and conduct the ESD current during the peak ESD voltage and current.

Figure 5:
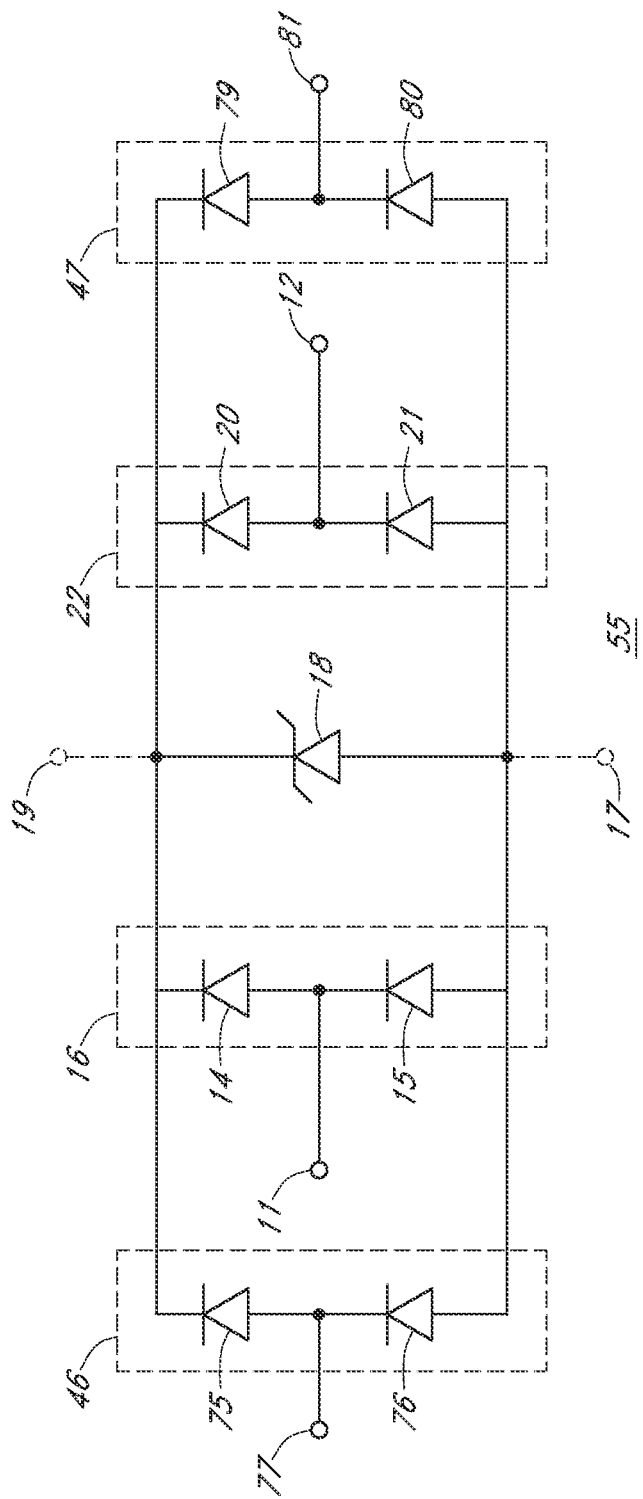
FIG. 5 schematically illustrates an embodiment of a portion of a circuit representation of an ESD device in accordance with some embodiments of the present application.

FIG. 5 schematically illustrates an embodiment of a portion of a circuit representation of ESD device 55 that is an alternate embodiment of device 10 that was depicted in FIGS. 1 to 4. The circuit schematic of device 55 is similar to the circuit schematic of device 10 except that device 55 includes additional channels. Channel 46 is parallel with channel 16 and channel 47 is parallel with channel 22. Channel 46 includes series connected P-N diode 75 and P-N diode 76 that have terminal 77 connected to a common node of diode 75 and diode 76. Also, channel 47 includes series connected P-N diode 79 and P-N diode 80 that have terminal 81 connected to a common node of diode 79 and diode 80.

The skilled artisan, guided by the teachings of the present application, will appreciate that device 10 as depicted in FIGS. 1-4 can be readily modified to include channel 46 and channel 47 of device 55 as depicted in FIG. 5. Diode 75 and diode 79 can be formed as doped regions overlying region 29 similar to respective diode 14 and diode 20 and corresponding region 42 and region 48. Each of the doped regions used for diode 75 and diode 79 can be within a separate, closed structure (e.g., polygons) that are formed by isolation trenches similar to trench 35 and trench 40, respectively. In order to form diode 75 and diode 79, region 29 may be made larger, such as extended in a direction that would be perpendicular to the page shown in FIG. 3 (or parallel to the page in FIG. 4). Isolation trench 38 can surround the expanded region 29, as well as regions corresponding to diode 14, diode 20, diode 75, and diode 79. Alternately, another region similar to region 29 may be formed on substrate 25 and electrically connected to region 29. Thus, region 29 or the additional region that is similar to region 29 can electrically connect the cathodes of diode 75 and diode 79 to the cathode of diode 18. Diode 76 and diode 80 would be formed in layer 33 and not overlying region 29. Each of the doped regions used for diode 76 and diode 80 can be within separate, closed structure (e.g., polygons) that are formed by isolation trenches similar to trench 37 and trench 39. Thus, the anode of diode 76 and diode 80 would be connected to the anode of diode 18 by substrate 25.

Figure 6:
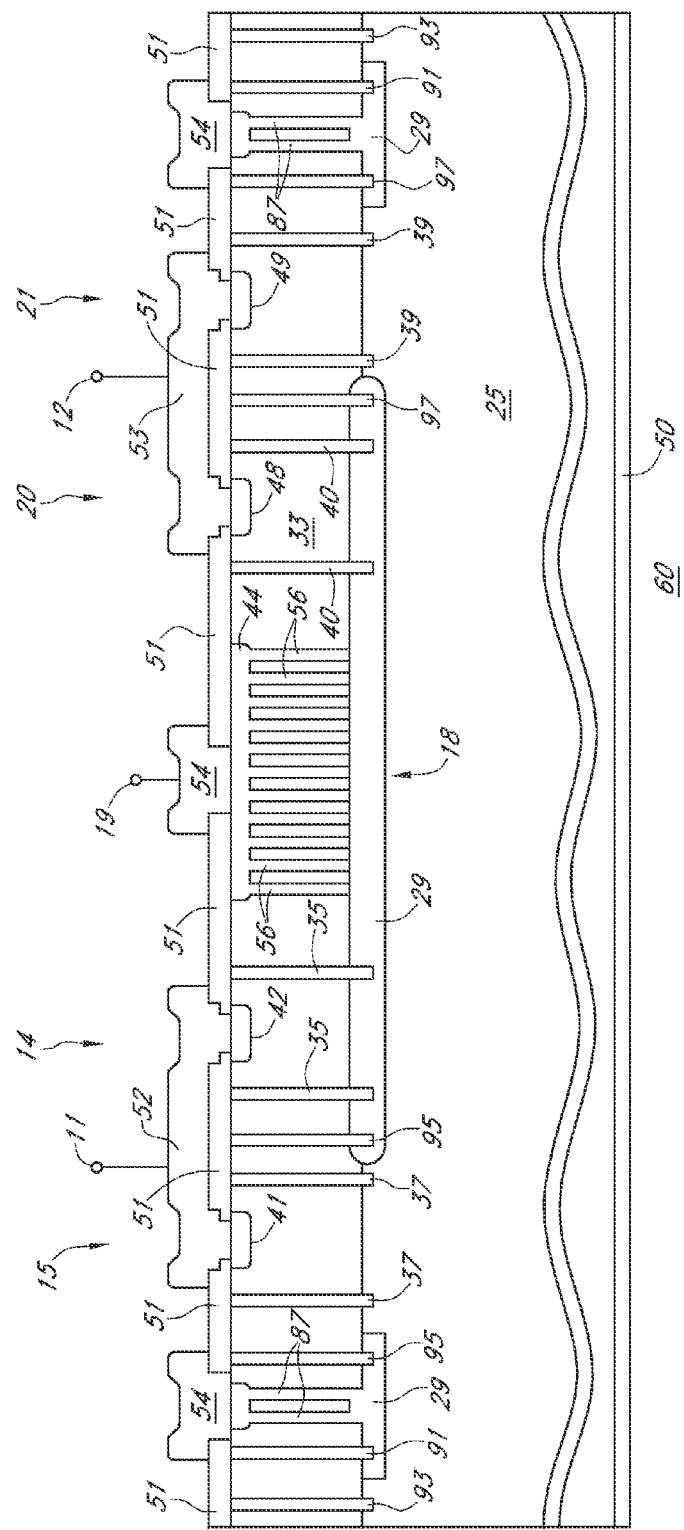
FIG. 6 illustrates a cross-sectional portion of an ESD device in accordance with some embodiments of the present application.

FIG. 6 illustrates a cross-sectional portion of ESD device 60 which is an alternate embodiment of device 10 that was explained in the description of FIGS. 1-4. Device 60 is similar to device 10 except that terminal 19 is also included Conductor 54 is connected to terminal 19 and provides a low resistance connection to region 44. Device 60 optionally includes plurality of conductors 56 which extend from region 44 to region 29. Conductors 56 may reduce the resistance of the connection between conductor 54 and the cathode of diode 18. Those skilled in the art, guided by the teaching of the present application, will appreciate that conductors 56 may provide reduced resistance without extending entirely through layer 33 to region 29. In some embodiments, conductors 56 can extend at least one-half of the distance from the surface of layer 33 toward region 29 and may extend further up to a distance that touches region 29. Conductors 56 may be formed by making an opening that extends from the surface through layer 33 to expose a portion of region 29. Thereafter, the opening is filled with a conductor, such as doped polysilicon, in order to form conductors 56, in another embodiment, the openings in which conductors 56 are formed may have a dielectric liner on the sidewalls but not on the bottom. Omitting the liner on the bottom facilitates forming electrical connection to region 29. Conductors 56 are optional and therefore some embodiments of device 60 do not include conductors extending from region 44 to region 29.

As shown in FIG. 6, device 60 does not include isolation trench 38 which surrounds region 29.

Conductor 54 also provides a low resistance connection to conducting region 87 which extends through layer 33 into region 29. Isolation trench 91 surrounds a portion of region 29 and extends through layer 33 and into a portion of region 29. Isolation trench 93 may surround the entire die containing device 60 to prevent leakage from device 60. In some embodiments, isolation trench 91 and isolation trench 93 have about the same depth as isolation trench 37. Isolation trench 93 extends through layer 33 and into a portion of substrate 25. Isolation trench 93 may surround the entire die containing device 60 to prevent leakage from device 60.

Device also includes isolation trench 95 which surrounds trench 37 and extends through layer 33 and into a portion of region 29. In some embodiments, isolation trench 37 is the same depth as isolation trench 95. Similarly, isolation trench 97 surrounds isolation trench 39 and extends through layer 33 and into a portion of region 29. In some embodiments trench 97 may be the same depth as trench 39.

Device 60 can be readily modified to include channel 46 and channel 47 as depicted in FIG. 5. For example, region 29 may be made larger, such as extended in a direction that would be perpendicular to the page shown in FIG. 6 to form diode 75 and 79. Region 33 may also be made larger to include diode 76 and diode 80.

Figure 7:
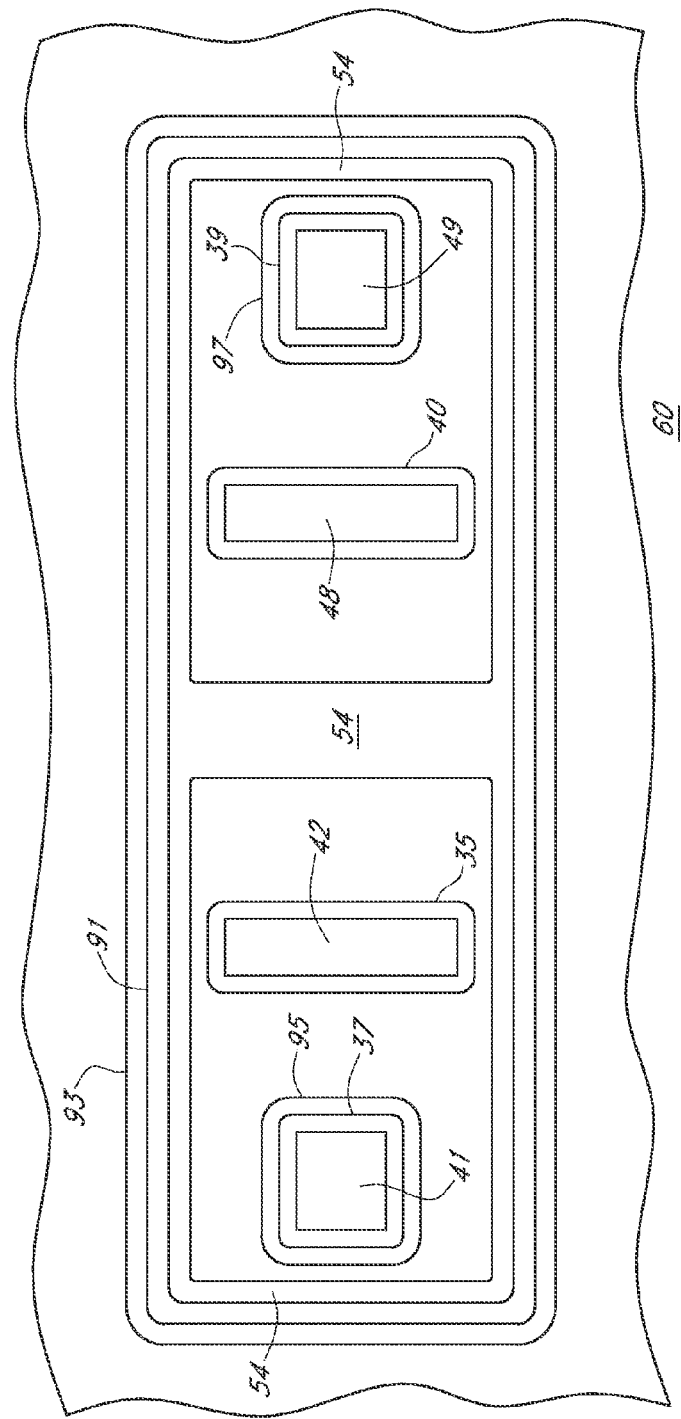
FIG. 7 is an enlarged partial plan view of one example of an ESD device in accordance with some embodiments of the present application.

FIG. 7 is an enlarged plan view of one example of device 60. Device 60 is generally configured the same as device 10 as depicted in FIG. 4. Isolation trench 93 surrounds conductive region 87, region 41, region 42, region 44, region 48, and region 49. Conductive region 54 is disposed between region 42 and region 48, and conductive region 54 also extends along the peripheral of the die adjacent to trench 91. As shown, device 60 does not include isolation trench 38 which surrounds isolation trench 35 isolation trench 40. However, in some embodiments, device 60 may include isolation trench 38 as depicted in FIGS. 3-4 for device 10.

Figure 8:
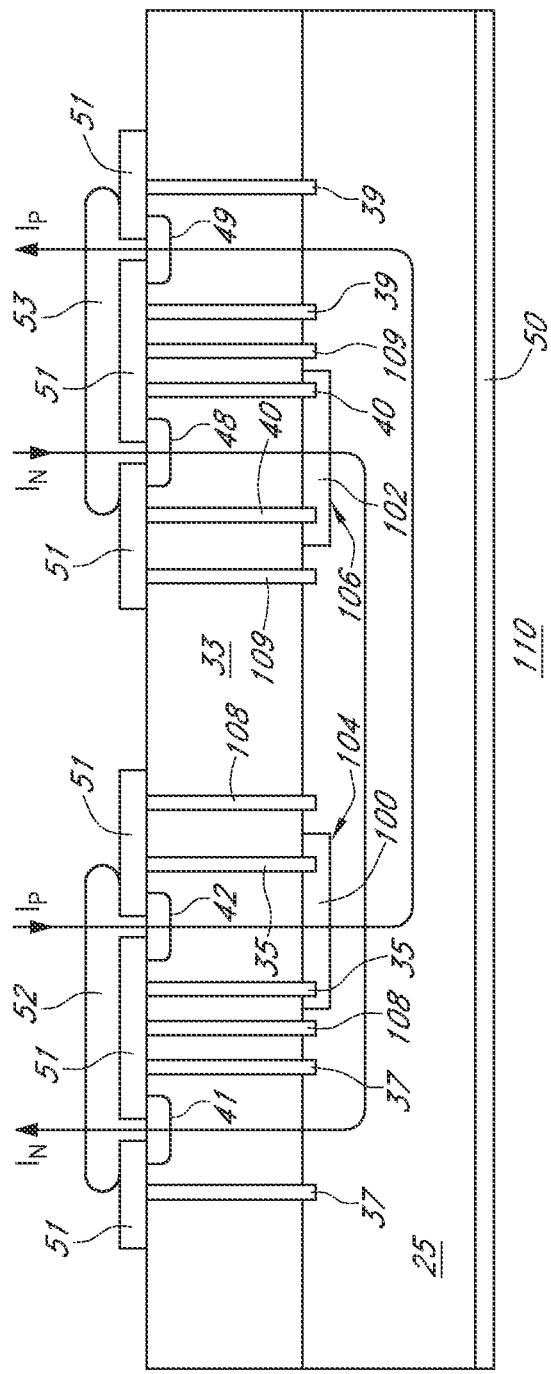
FIG. 8 illustrates a cross-sectional portion of an ESD device in accordance with some embodiments of the present application.

FIG. 8 illustrates a cross-sectional view of a portion of one example of ESD device 110. Device 110 has a similar configuration to device 10 in FIG. 2, except that device 110 includes two zener diodes: zener diode 104 and zener diode 106. Zener diode 104 is formed at the interface of semiconductor region 100 and semiconductor substrate 25. Zener diode 106 is also formed at the interface of semiconductor region 102 and semiconductor substrate 25. Region 100 is surrounded by isolation trench 108, while region 102 is surrounded by isolation trench 109. Accordingly, region 100 and region 102 are electrically isolated to form separate zener diodes.

From all the foregoing one skilled in the art can determine that according to one embodiment, an ESD device comprises: a semiconductor substrate of a first conductivity type and having a first doping concentration, the semiconductor substrate having first and second surfaces; a first semiconductor layer of a second conductivity type on the first surface of the semiconductor substrate, wherein the first semiconductor layer has a first surface that is disposed between the first surface of the semiconductor substrate and a second surface of the semiconductor layer, and wherein the first semiconductor layer has a second doping concentration; a first semiconductor region of the second conductivity type positioned between a first portion of the first semiconductor layer and the first surface of the semiconductor substrate, the first semiconductor region forming a zener diode with dopants of the semiconductor substrate; a first P-N diode formed in the first semiconductor layer and overlying a first portion of the first semiconductor region; wherein the first P-N diode is external to the first isolation trench; a first isolation trench extending from the second surface of the first semiconductor layer into a portion of the first semiconductor region, the first isolation trench forming a closed structure that surrounds the first P-N diode and a second portion of the first semiconductor layer overlaying the first semiconductor region; and a second P-N diode formed in the first semiconductor layer and laterally displaced from the first semiconductor region, wherein the second P-N diode is external to the first isolation trench.

From all the foregoing one skilled in the art can determine that according to one embodiment, a method of making an ESD device comprises: providing a semiconductor substrate of a first conductivity type and having a first doping concentration, the semiconductor substrate having first and second surfaces; forming on the first surface of the semiconductor substrate a first semiconductor layer of a second conductivity type having a second doping concentration that is less than the first doping concentration, the first semiconductor layer have a first surface disposed between the first surface of the semiconductor substrate and a second surface of the semiconductor layer; forming a first semiconductor region of the second conductivity type positioned between a first portion of the first semiconductor layer and the first surface of the semiconductor substrate wherein a zener diode is formed by the first semiconductor region; forming a first doped region in a second portion of the first semiconductor layer overlaying the first semiconductor region, where the first doped region has the first conductivity, and wherein the first doped region and the first semiconductor layer together form a P-N diode; forming a second doped region in a third portion the first semiconductor layer that is laterally displaced from the first doped region and the first semiconductor region, wherein the first doped region has the second conductivity, and wherein the second doped region and the first semiconductor layer together form a P-N diode; and forming a first isolation trench extending from the second surface of the first semiconductor layer into a portion of the first semiconductor region, the first isolation trench having a closed structure that surrounds the first region doped and a fourth portion of the first semiconductor layer overlaying the first semiconductor region.

In view of all of the above, it is evident that a novel device and method is disclosed. Included, among other features, forming reduced depth isolation trenches so that two or more terminal may share a single zener diode. Furthermore, additional isolation trenches are disclosed that can reduce leakage between components.

While the subject matter of the invention is described with specific preferred embodiments and example embodiments, the foregoing drawings and descriptions thereof depict only typical embodiments of the subject matter and are not therefore to be considered to be limiting of its scope, it is evident that many alternatives and variations will be apparent to those skilled in the art.

What is claimed is:

1. An ESD device comprising:
   a semiconductor substrate of a first conductivity type and having a first doping concentration, the semiconductor substrate having first and second surfaces;
   a first semiconductor layer of a second conductivity type on the first surface of the semiconductor substrate, wherein the first semiconductor layer has a first surface that is disposed between the first surface of the semiconductor substrate and a second surface of the semiconductor layer, and wherein the first semiconductor layer has a second doping concentration;

a first semiconductor region of the second conductivity type positioned between a first portion of the first semiconductor layer and the first surface of the semiconductor substrate, the first semiconductor region forming a zener diode with dopants of the semiconductor substrate;

a first P-N diode formed in the first semiconductor layer and overlying a first portion of the first semiconductor region;

a first isolation trench extending from the second surface of the first semiconductor layer into a portion of the first semiconductor region, the first isolation trench forming a closed structure that surrounds the first P-N diode and a second portion of the first semiconductor layer overlaying the first semiconductor region; and a second P-N diode formed in the first semiconductor layer and laterally displaced from the first semiconductor region, wherein the second P-N diode is external to the first isolation trench.

2. The ESD device of claim 1, further comprising a second isolation trench extending from the second surface of the first semiconductor layer into a portion of the semiconductor substrate, the second isolation trench forming a closed structure that surrounds the second P-N diode, wherein the first P-N diode is external to the second isolation trench.

3. The ESD device of claim 1, further comprising a third isolation trench extending from the second surface of the first semiconductor layer into a portion of the semiconductor substrate, the third isolation trench forming a closed structure that surrounds the first semiconductor region and the first P-N diode.

4. The ESD device of claim 3, wherein a depth of the first isolation trench is about the same as a depth of the third isolation trench.

5. The ESD device of claim 1, wherein the first doping concentration is no less than approximately $1 \times 10^{19}$ atoms/cm$^3$ and the second doping concentration is no greater than approximately $1 \times 10^{17}$ atoms/cm$^3$.

6. The ESD device of claim 1, further comprising a first doped region of the second conductivity type formed on a surface of the first semiconductor layer and overlying a second portion of the first semiconductor region, wherein the first doped region is laterally separated from the first P-N diode.

7. The ESD device of claim 6, further comprising a first conductor forming electrical contact to the first doped region at the surface of the first semiconductor layer.

8. The ESD device of claim 7, further comprising a plurality of conductors of the second conductivity type having a doping concentration that is greater than the second doping concentration, the plurality of conductors extending from the first doped region to the first semiconductor region through the first semiconductor layer.

9. The ESD device of claim 8, further comprising a second conductor and a conducting region of the second conductivity type extending from the second conductor to the semiconductor substrate through the first semiconducting layer, wherein the conducting region has a doping concentration that is greater than the second doping concentration, and wherein the second conductor region is external to the first isolation trench.

10. The ESD device of claim 9, further comprising a fourth isolation trench extending from the second surface of the first semiconductor layer into a portion of the conducting region within the semiconductor substrate, the fourth isolation trench forming a closed structure that surrounds a portion the conducting region, wherein the first P-N diode and the second P-N diode are external to the fourth isolation trench.

11. The ESD device of claim 10, further comprising a fifth isolation trench extending from the second surface of the first semiconductor layer into a portion of the semiconductor substrate, the fifth isolation trench forming a closed structure that surrounds the conducting region, the first P-N diode, the second P-N diode, and the first semiconducting region.

12. A method of forming an ESD device comprising:
providing a semiconductor substrate of a first conductivity type and having a first doping concentration, the semiconductor substrate having first and second surfaces;

forming on the first surface of the semiconductor substrate a first semiconductor layer of a second conductivity type having a second doping concentration that is less than the first doping concentration, the first semiconductor layer having a first surface disposed between the first surface of the semiconductor substrate and a second surface of the semiconductor layer;

forming a first semiconductor region of the second conductivity type positioned between a first portion of the first semiconductor layer and the first surface of the semiconductor substrate wherein a zener diode is formed by the first semiconductor region;

forming a first doped region in a second portion of the first semiconductor layer overlaying the first semiconductor region, where the first doped region has the first conductivity, and wherein the first doped region and the first semiconductor layer together form a P-N diode;

forming a second doped region in a third portion the first semiconductor layer that is laterally displaced from the first doped region and the first semiconductor region, wherein the first doped region has the second conductivity, and wherein the second doped region and the first semiconductor layer together form a P-N diode; and forming a first isolation trench extending from the second surface of the first semiconductor layer into a portion of the first semiconductor region, the first isolation trench having a closed structure that surrounds the first doped region and a fourth portion of the first semiconductor layer overlaying the first semiconductor region.

13. The method of claim 12, wherein the first doping concentration is no less than approximately $1 \times 10^{19}$ atoms/cm$^3$ and the second doping concentration is no greater than approximately $1 \times 10^{17}$ atoms/cm$^3$.

14. The method of claim 12, further comprising forming a second isolation trench extending from the second surface of the first semiconductor layer into a portion of the semiconductor substrate, the second isolation trench forming a closed structure that surrounds the second doped region and a fifth portion of the first semiconductor layer overlaying the semiconductor substrate, wherein the first doped region is external to the second isolation trench.

15. The method of claim 12, further comprising forming a third doped region of the second conductivity type formed on a surface of the first semiconductor layer overlying a first portion of the first semiconductor region, wherein the third doped region is laterally separated from the first doped region.

16. The method of claim 15, further comprising forming a first conductor having electrical contact to the third doped region at the surface of the first semiconductor layer.

17. The method of claim 16, further comprising forming a plurality of conductors of the second conductivity type having a doping concentration that is greater than the second doping concentration, the plurality of conductors extending from the third doped region to the first semiconductor region through the first semiconductor layer.

18. The method of claim 17, further comprising forming a second conductor and forming a conducting region of the second conductivity type extending from the second conductor to the semiconductor substrate through the first semiconducting layer, wherein the conducting region has a doping concentration that is greater than the second doping concentration, and wherein the second conductor region is external to the first isolation trench.

19. The method of claim 18, further comprising a fourth isolation trench extending from the second surface of the first semiconductor layer into a portion of the conducting region within the semiconductor substrate, the fourth isolation trench forming a closed structure that surrounds a portion the conducting region, wherein the first P-1N diode and the second P-N diode are external to the fourth isolation trench.

20. An ESD device comprising:
a semiconductor substrate of a first conductivity type and having a first doping concentration, the semiconductor substrate having first and second surfaces;
a first semiconductor layer of a second conductivity type on the first surface of the semiconductor substrate, wherein the first semiconductor layer has a first surface that is disposed between the first surface of the semiconductor substrate and a second surface of the semiconductor layer, and wherein the first semiconductor layer has a second doping concentration;
a first semiconductor region of the second conductivity type positioned between a first portion of the first semiconductor layer and the first surface of the semiconductor substrate, the first semiconductor region forming a zener diode with dopants of the semiconductor substrate;
a first P-N diode formed in the first semiconductor layer and overlying a first portion of the first semiconductor region;
a first isolation trench extending from the second surface of the first semiconductor layer into a portion of the first semiconductor region, the first isolation trench forming a closed structure that surrounds the first P-N diode and a second portion of the first semiconductor layer overlaying the first semiconductor region;
a second P-N diode formed in the first semiconductor layer and laterally displaced from the first semiconductor region, wherein the second P-N diode is external to the first isolation trench;
a second isolation trench extending from the second surface of the first semiconductor layer into a portion of the semiconductor substrate, the second isolation trench forming a closed structure that surrounds the second P-N diode, wherein the first P-N diode is external to the second isolation trench;
a third P-N diode formed in the first semiconductor layer and overlying a second portion of the first semiconductor region, wherein the third P-N diode is laterally displaced from the first P-N diode;
a third isolation trench extending from the second surface of the first semiconductor layer into a portion of the first semiconductor region, the third isolation trench forming a closed structure that surrounds the third P-N diode and a third portion of the first semiconductor layer overlaying the first semiconductor region, wherein the first P-N diode and the second P-N diode are external to the third isolation trench;
a fourth P-N diode formed in the first semiconductor layer and laterally displaced from the first semiconductor region, wherein the fourth P-N diode is external to the first isolation trench, the second isolation trench, and the third isolation trench;
a fourth isolation trench extending from the second surface of the first semiconductor layer into a portion of the semiconductor substrate, the fourth isolation trench forming a closed structure that surrounds the fourth P-N diode, wherein the first P-N diode, the second P-N diode, and the third P-N diode are external to the fourth isolation trench;
a first doped region of the second conductivity type formed on a surface of the first semiconductor layer and overlying a third portion of the first semiconductor region, wherein the first doped region is laterally separated from the first P-N diode and the third P-N diode;
a first conductor electrically connected to the first doped region;
a fifth isolation trench extending from the second surface of the first semiconductor layer into a portion of the first semiconductor region, the fifth isolation trench forming a dosed structure that surrounds the first P-N diode, the second P-N diode, the third P-N diode, and fourth P-N diode; and
a sixth isolation trench extending from the second surface of the first semiconductor layer into a portion of the semiconductor substrate, the sixth isolation trench forming a closed structure that surrounds the fifth isolation trench.

* * * * *